United States Patent
Hayashi

(10) Patent No.: US 9,202,724 B2
(45) Date of Patent: Dec. 1, 2015

(54) SUBSTRATE TREATMENT APPARATUS AND SUBSTRATE TREATMENT METHOD

(75) Inventor: Konosuke Hayashi, Fujisawa (JP)

(73) Assignee: Shibaura Mechatronics Corporation, Yokohama-shi (JP)

( * ) Notice: Subject to any disclaimer, the term of this patent is extended or adjusted under 35 U.S.C. 154(b) by 421 days.

(21) Appl. No.: 12/621,663

(22) Filed: Nov. 19, 2009

(65) Prior Publication Data

US 2010/0122772 A1   May 20, 2010

(30) Foreign Application Priority Data

Nov. 20, 2008   (JP) ................................. 2008-296301
Nov. 6, 2009   (JP) ................................. 2009-254548

(51) Int. Cl.
| | | |
|---|---|---|
| H01L 21/465 | (2006.01) | |
| H01L 21/67 | (2006.01) | |
| H01L 21/02 | (2006.01) | |
| B08B 3/02 | (2006.01) | |
| B08B 9/08 | (2006.01) | |
| B08B 9/093 | (2006.01) | |
| B08B 9/28 | (2006.01) | |
| F26B 5/00 | (2006.01) | |

(52) U.S. Cl.
CPC ........... *H01L 21/67051* (2013.01); *B08B 3/024* (2013.01); *B08B 9/0813* (2013.01); *B08B 9/093* (2013.01); *B08B 9/28* (2013.01); *F26B 5/005* (2013.01); *H01L 21/02057* (2013.01); *H01L 21/6708* (2013.01); *H01L 21/67046* (2013.01)

(58) Field of Classification Search
USPC .................... 156/345.21, 345.55, 345.17; 257/E21.485
See application file for complete search history.

(56) References Cited

U.S. PATENT DOCUMENTS

| 7,105,074 B2* | 9/2006 | Tamada et al. ............ 156/345.23 |
| 2005/0188920 A1* | 9/2005 | Shimoda ........................ 118/663 |
| 2007/0017555 A1* | 1/2007 | Sekiguchi et al. .............. 134/33 |
| 2007/0087456 A1* | 4/2007 | Hashizume ........................ 438/6 |
| 2010/0122772 A1* | 5/2010 | Hayashi ................... 156/345.21 |

FOREIGN PATENT DOCUMENTS

| JP | 5-299400 | 11/1993 |
| JP | 2004-261701 | 9/2004 |
| JP | 2007-36180 | 2/2007 |
| JP | 2007-103825 | 4/2007 |

OTHER PUBLICATIONS

Machine Generated English Translation of JP 2007-103825 published Apr. 19, 2007.*
Korean Office Action issued Apr. 19, 2011, in Patent Application No. 10-2009-0110953 (with English-language translation).
Japanese Office Action issued Sep. 3, 2013, in Japan Patent Application No. 2009-254548 (with Partial English translation).

* cited by examiner

*Primary Examiner* — Sylvia R MacArthur
(74) *Attorney, Agent, or Firm* — Oblon, McClelland, Maier & Neustadt, L.L.P.

(57) ABSTRACT

Provided is a substrate treatment apparatus that treats a surface of a substrate while rotating the substrate. The substrate treatment apparatus includes: a physical tool unit including a physical tool configured to treat the surface of the substrate; a nozzle unit including a liquid supply nozzle configured to supply a liquid to the surface of the substrate and a gas supply nozzle configured to supply a gas to the surface of the substrate; a physical-tool-unit moving mechanism configured to move the physical tool unit along the surface of the substrate; and a nozzle-unit moving mechanism configured to move the nozzle unit along the surface of the substrate.

5 Claims, 8 Drawing Sheets

SUBSTRATE TREATMENT APPARATUS AND SUBSTRATE TREATMENT METHOD

CROSS REFERENCE OF THE RELATED APPLICATION

This application is based on and claims the benefit of priority from Japanese Patent Applications No. 2008-296301, filed on Nov. 20, 2008 and No. 2009-254548, filed on Nov. 6, 2009; the entire contents of which are incorporated herein by reference.

BACKGROUND OF THE INVENTION

1. Field of the Invention

The present invention relates to a substrate treatment apparatus and a substrate treatment method, and specifically relates to a substrate treatment apparatus and a substrate treatment method for treating the surface of a substrate such as a semiconductor wafer, for example, that is an object to be treated.

2. Description of the Related Art

As an example, a substrate treatment apparatus treats a substrate such as a semiconductor wafer by supplying a liquid such as a chemical solution to the substrate during the manufacturing process of the substrate. Patent Document 1 (JP-A No. 2007-103825 (KOKAI)) discloses a structure for supplying a treatment liquid to a substrate from a treatment nozzle attached to an arm. In the structure, a substrate is held on top of a rotatable table, and the treatment nozzle supplies the treatment liquid to the substrate while moving along the movement of the arm.

When the substrate treatment apparatus disclosed in Patent Document 1 is used and if the surface of the substrate is a hydrophobic surface, the surface of the substrate becomes so dry during the treatment that the coatability of the liquid on the substrate is impaired. Consequently, water marks (spots left by water) are left on the surface of the substrate.

When a substrate treatment apparatus equipped both with a physical tool for treating a surface of a substrate and with a fixed nozzle for supplying a treatment liquid to the surface, the immovable fixed nozzle causes the treatment liquid to be pooled on a portion of the surface of the substrate, and thereby sometimes causes particles to adhere to the portion.

In addition, when the substrate is scanned by the physical tool, the gas (or the treatment liquid) supplied by the physical tool and the treatment liquid supplied by the fixed nozzle interfere with each other to splash. The splashed liquid leaves watermarks (spots left by water) on the surface of the substrate when the surface is dried with the splashed liquid left thereon.

Besides the interference of the liquids with each other, the interference of the swing arm body (physical tool) that is moving for the scanning also causes the treatment liquid supplied by the fixed nozzle to splash. The liquid thus splashed leaves watermarks (spots left by water) on the surface of the substrate when the surface is dried with the splashed liquid left thereon.

SUMMARY OF THE INVENTION

An object of the present invention is providing a substrate treatment apparatus and a substrate treatment method capable of improving the coatability of a liquid on the entire surface a substrate such as a semiconductor wafer and preventing the drying of the surface during the treatment so that the formation of the water marks can be reduced.

A first aspect according to embodiments of the present invention is a substrate treatment apparatus that treats a surface of a substrate while rotating the substrate. The substrate treatment apparatus includes: a physical tool unit including a physical tool configured to treat the surface of the substrate; a nozzle unit including a liquid supply nozzle configured to supply a liquid to the surface of the substrate and a gas supply nozzle configured to supply a gas to the surface of the substrate; a physical-tool-unit moving mechanism configured to move the physical tool unit along the surface of the substrate; and a nozzle-unit moving mechanism configured to move the nozzle unit along the surface of the substrate.

A second aspect according to the embodiments of the present invention is a substrate treatment method for treating a surface of a substrate while rotating the substrate. The substrate treatment method includes: causing a physical-tool-unit moving mechanism to linearly move a physical tool unit along the surface of the substrate, the physical tool unit including a physical tool configured to treat the surface of the substrate; and causing a nozzle-unit moving mechanism to linearly move a nozzle unit along the surface of the substrate in a direction opposite to a direction in which the physical tool unit is linearly moved, the nozzle unit including a liquid supply nozzle configured to supply a liquid to the surface of the substrate and a gas supply nozzle configured to supply a gas to the surface of the substrate.

DESCRIPTION OF THE PREFERRED EMBODIMENTS

Figure 1:
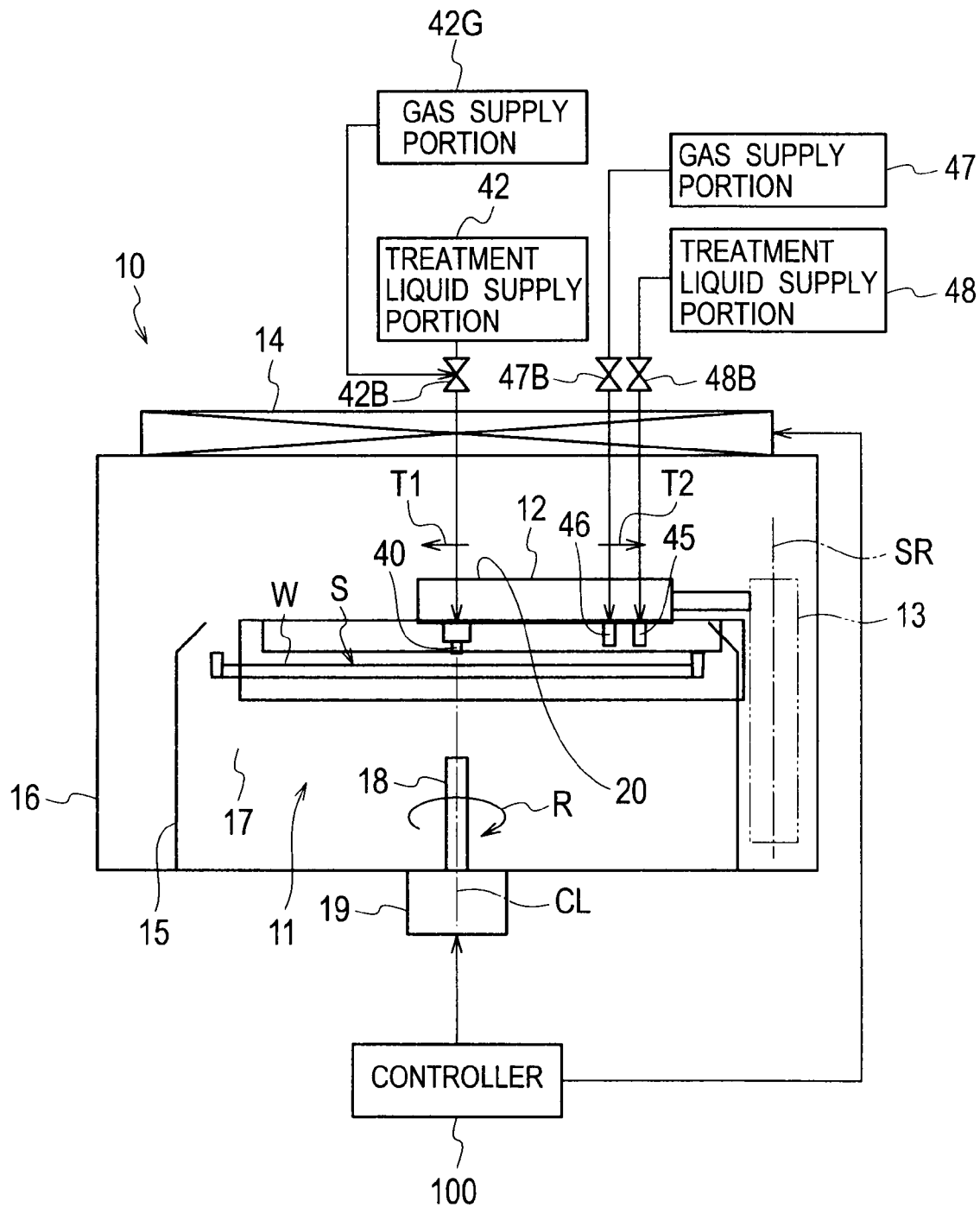
FIG. 1 is a diagram illustrating the entire configuration of a substrate treatment apparatus according to the present invention.

Some embodiments of the present invention will be described by referring to the drawings.

Figure 2:
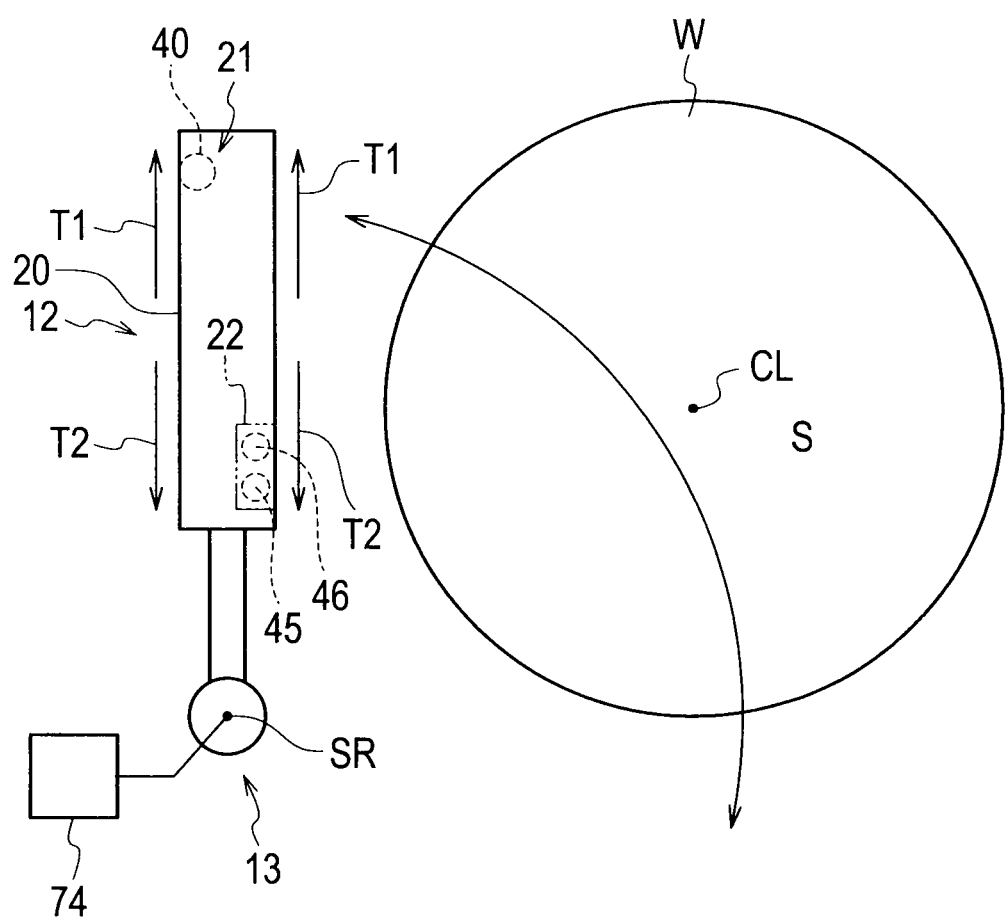
FIG. 2 is a plan view illustrating a substrate W, a nozzle head device, and a nozzle-head-device moving unit.

FIG. 1 is a diagram illustrating a substrate treatment apparatus according to a preferred embodiment of the present invention. FIG. 2 is a plan view illustrating a nozzle head device and a nozzle-head-device moving unit of the substrate treatment apparatus shown in FIG. 1.

A substrate treatment apparatus 10 shown in FIG. 1 is used, for example, as a cleaning apparatus for removing particles from a surface S of a substrate W. The substrate treatment apparatus 10 includes a substrate holder 11, a nozzle head device 12, a nozzle-head-device moving unit 13, and a downflow fan 14 equipped with a filter, a cup 15, and a treatment chamber 16.

The substrate holder 11 includes a base member 17, a rotary shaft 18, and a motor 19. The substrate W is detachably fixed on top of the base member 17. The cup 15, the base member 17, and the rotary shaft 18 of the motor 19 are housed in the treatment chamber 16. The base member 17 is fixed to the top end portion of the rotary shaft 18. The motor 19 is activated by an instruction of a controller 100, and the action of the motor 19 makes the base member 17 and the substrate W rotate continuously in an R direction. The fan 14 is activated by an instruction of the controller 100.

Next, exemplary structures of the nozzle head device 12 and the nozzle-head-device moving unit 13 shown in FIG. 1 will be described by referring to FIGS. 2 to 6.

Figure 3:
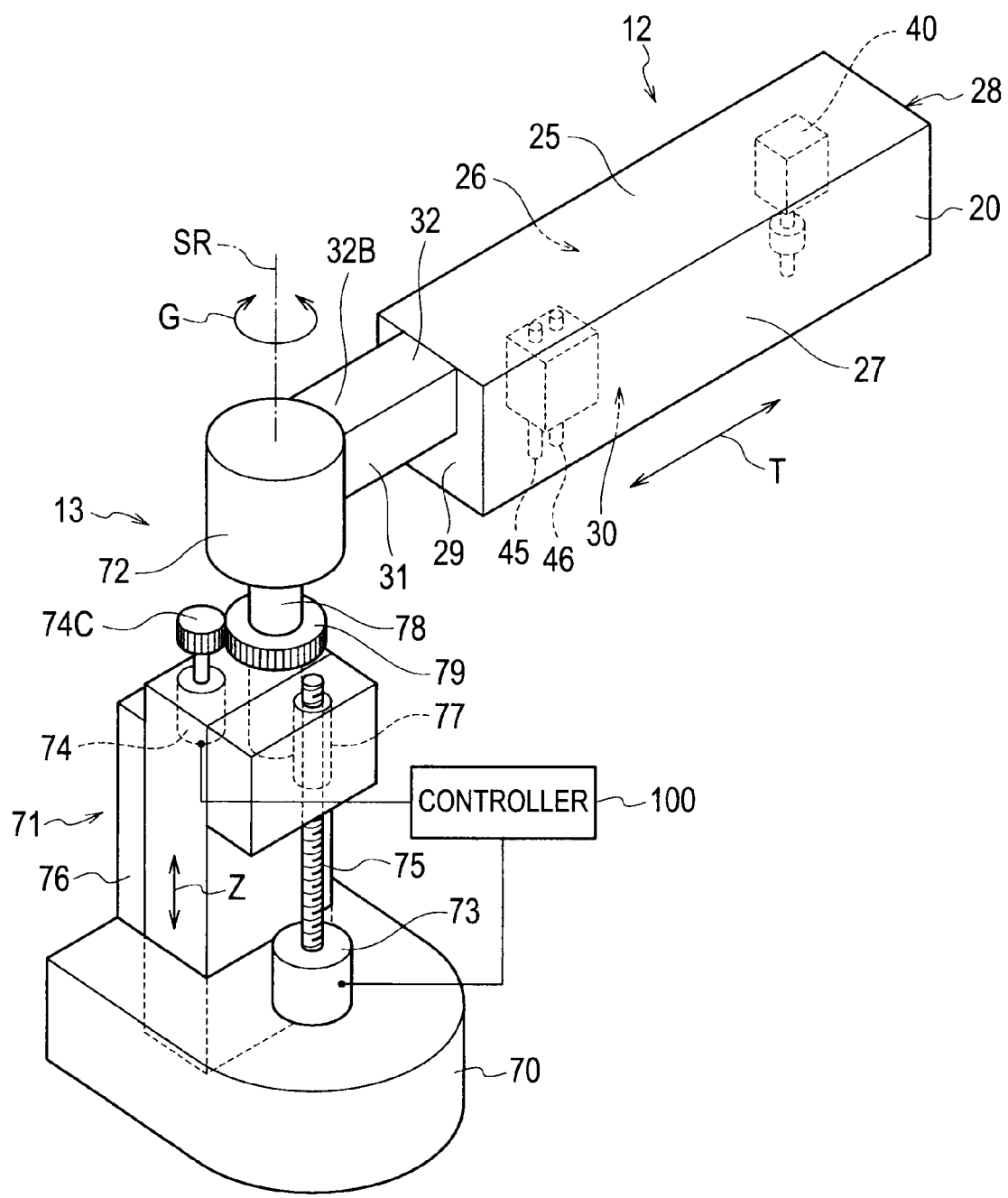
FIG. 3 is a perspective view illustrating the nozzle head device and the nozzle-head-device moving unit.
Figure 4:
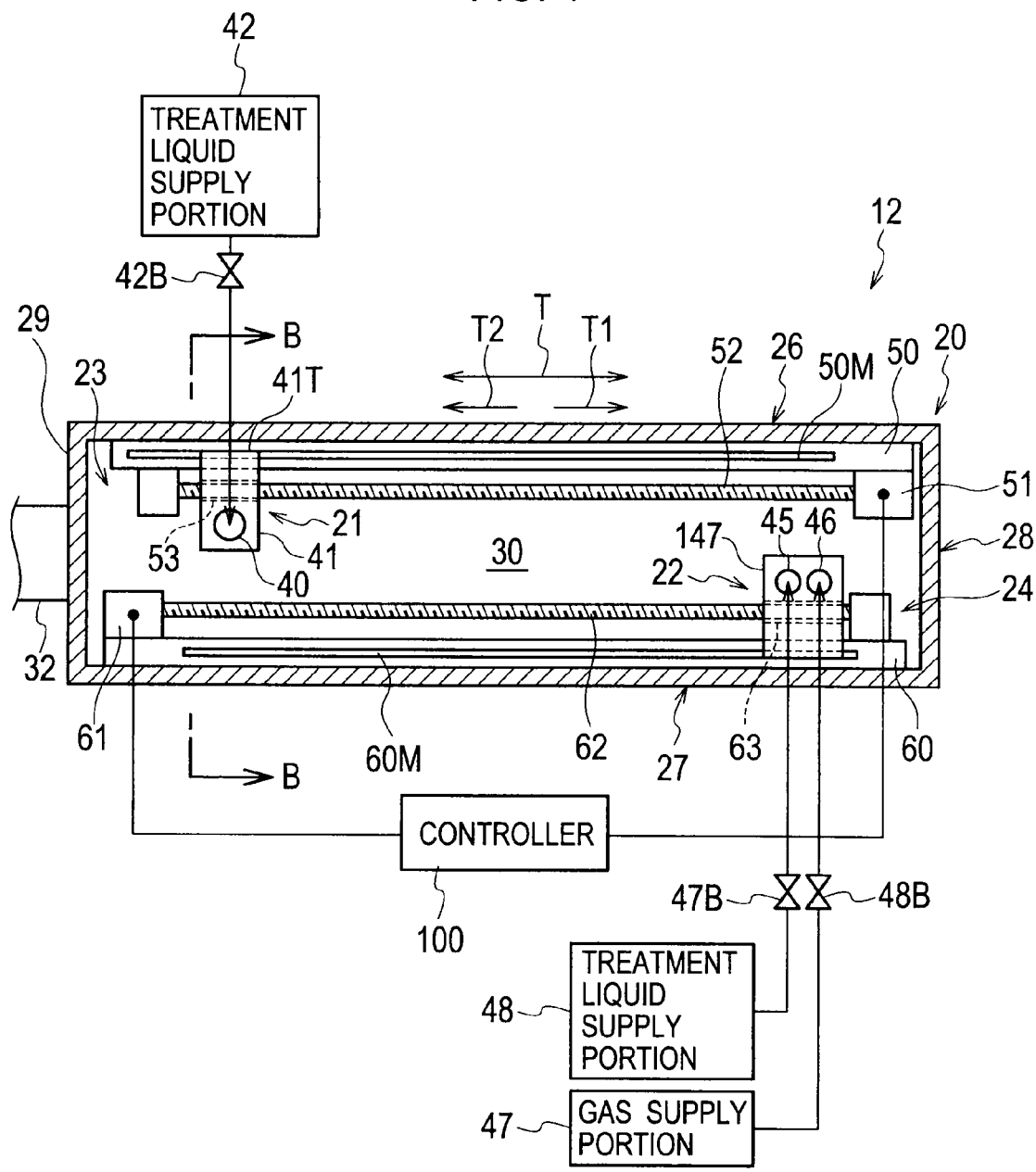
FIG. 4 is a diagram illustrating the internal structure of the nozzle head device.
Figure 5:
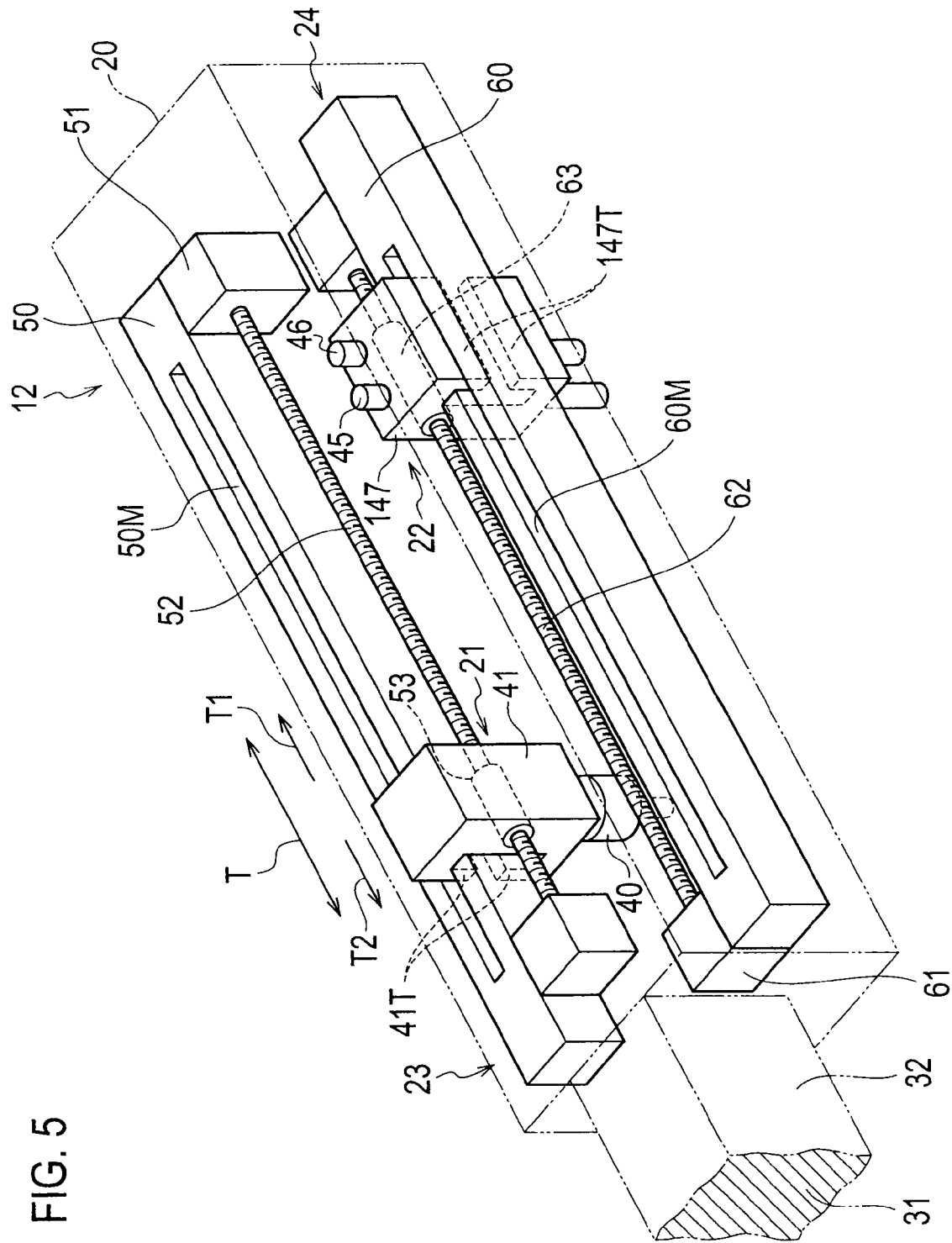
FIG. 5 is a perspective view illustrating the internal structure of the nozzle head device.
Figure 6:
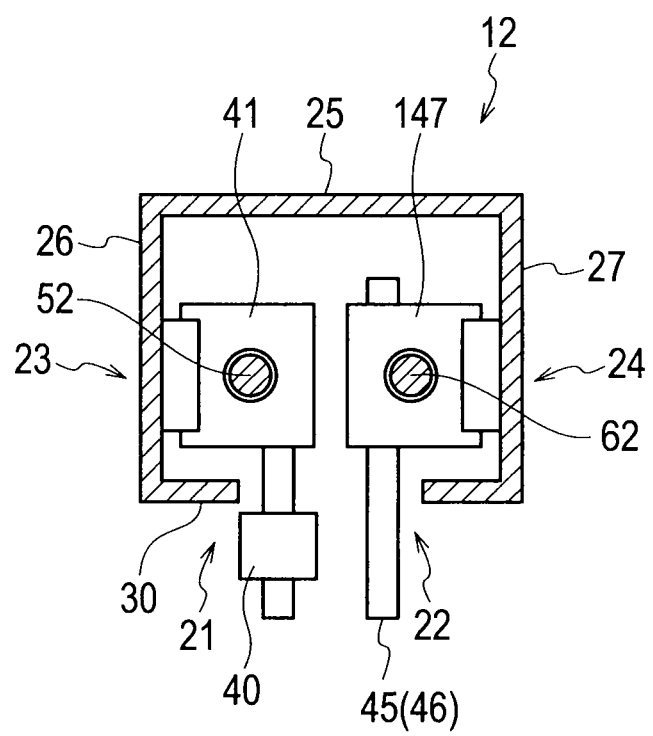
FIG. 6 is a sectional view of the nozzle head device taken along the line B-B shown in FIG. 4.

FIG. 3 is a perspective view illustrating the nozzle head device 12 and the nozzle-head-device moving unit 13. FIG. 4 is a plan view illustrating an exemplary internal structure of the nozzle head device 12 by removing the top cover of the nozzle head device 12. FIG. 5 is a perspective view illustrating an internal structure of the nozzle head device 12. FIG. 6 is a sectional view of the nozzle head device 12 taken along the line B-B of FIG. 4.

FIGS. 3 and 4 show that the nozzle head device 12 includes a case 20 that has a long box shape, a physical tool unit 21, a liquid supply nozzle/gas supply nozzle unit 22, a mechanism 23 for moving the physical tool unit 21, and a mechanism 24 for moving the liquid supply nozzle/gas supply nozzle unit 22.

The physical tool unit 21, the liquid supply nozzle/gas supply nozzle unit 22, the mechanism 23 for moving the physical tool unit 21, and the mechanism 24 for moving the liquid supply nozzle/gas supply nozzle unit 22 are installed in the case 20.

The case 20 shown in FIGS. 1 and 2 is made, for example, of a metal material. As FIGS. 3, 4, and 6 show, the case 20 includes a top surface portion 25, side surface portions 26, 27, 28, and 29, and a bottom surface portion 30. The top surface portion 25 and the side surface portions 26 and 27 are long, plate-shaped members extending in T directions. The side surface portion 28 and 29 correspond respectively to the front-end portion and the rear-end portion of the case 20. The side surface portion 29 is fixed to a first end portion 32 of an arm portion 31 included in the nozzle-head-device moving unit 13.

Exemplary structures of the physical tool unit 21, the liquid supply nozzle/gas supply nozzle unit 22, the mechanism 23 for moving the physical tool unit 21, the mechanism 24 for moving the liquid supply nozzle/gas supply nozzle unit 22 will be described by referring to FIGS. 4 and 5.

The physical tool unit 21 includes a physical tool 40 and a holder 41 that holds the physical tool 40. The physical tool 40 is a spray nozzle, and is connected, via a valve 42B, both to a treatment liquid supply portion 42 and to a gas supply portion 42G. The treatment liquid supply portion 42 is supplied with a liquid for spraying, for example, pure water. The gas supply portion 42G is supplied with a gas, for example, a nitrogen gas. Accordingly, the treatment liquid supply portion 42 and the gas supply portion 42G can supply a liquid for spray, which is a treatment liquid (mist) made by mixing a liquid and a gas together, to the physical tool 40 and then to the surface S of the substrate W shown in FIG. 1.

The physical tool 40 is a tool capable of performing a physical treatment on the surface S of the substrate W. Some examples of the physical tool 40 other than a spray nozzle are an ultrasonic nozzle and a brush. The treatment liquid is supplied to the brush.

The liquid supply nozzle/gas supply nozzle unit 22 includes a liquid supply nozzle 45, a gas supply nozzle 46, and a holder 147 that holds the liquid supply nozzle 45 and the gas supply nozzle 46 arranged side by side along the T directions.

The liquid supply nozzle 45 is connected to a treatment liquid supply portion 48 via a valve 48B. The treatment liquid supply portion 48 stores a liquid for treatment, such as etching liquid, cleaner liquid, and pure water. The liquid supply nozzle 45 is capable of supplying a treatment liquid to the surface S of the substrate W shown in FIG. 1.

The gas supply nozzle 46 is connected to a gas supply portion 47 via a valve 47B, and is capable of supplying an inert gas, such as a nitrogen gas, to the top surface of the substrate W shown in FIG. 1.

The mechanism 23 for moving the physical tool unit 21 shown in FIGS. 4 and 5 includes a guide rail 50, a motor 51, and a feed screw 52. The guide rail 50 is fixed to the inner surface of the side surface portion 26 of the case 20 so as to extend in the T directions. The guide rail 50 includes a groove portion 50M for guiding. A protrusion 41T of the holder 41 included in the physical tool unit 21 meshes with the groove portion 50M. The feed screw 52 meshes with a nut 53 of the holder 41. When the feed screw 52 is rotated by the driving of the motor 51, the physical tool unit 21 including the holder 41 and the physical tool 40 is linearly moved either in the T1 direction or in the T2 direction. Thus the position of the physical tool unit 21 can be determined.

The mechanism 24 for moving the liquid supply nozzle/gas supply nozzle unit 22 shown in FIGS. 4 and 5 includes a guide rail 60, a motor 61, and a feed screw 62. The guide rail 60 is fixed to the inner surface of the side surface portion 27 of the case 20 so as to extend in the T directions. The guide rail 60 includes a groove portion 60M for guiding. A protrusion 147T of the holder 147 included in the liquid supply nozzle/gas supply nozzle unit 22 meshes with the groove portion 60M. The feed screw 62 meshes with a nut 63 of the holder 147. When the feed screw 62 is rotated by the driving of the motor 61, the liquid supply nozzle/gas supply nozzle unit 22 including the holder 147 is linearly moved either in the T1 direction or in the T2 direction. Thus the position of the liquid supply nozzle/gas supply nozzle unit 22 can be determined.

Next, an exemplary structure of the unit 13 for moving the nozzle head device 12 will be described by referring to FIG. 3.

The unit 13 for moving the nozzle head device 12 shown in FIG. 3 has a function of swinging the nozzle head device 12 about a rotating center axis SR in G directions and a function of moving vertically the nozzle head device 12 in Z directions parallel with the directions in which the rotating center axis SR extends.

The unit 13 for moving the nozzle head device 12 includes a base portion 70, a vertical movement unit 71, a rotation support unit 72, a motor 73, a motor 74, and a feed screw 75. A second end portion 32B of the arm portion 31 included in the nozzle head device 12 is fixed to the rotation support unit 72. The arm portion 31 and the nozzle head device 12 extend in the radial direction of the rotation support unit 72. The motor 73 is supported by the base portion 70 whereas the motor 74 is supported by the vertical movement unit 71.

The motor 73 is capable of rotating the feed screw 75, which meshes with a nut 77 of the vertical movement unit 71. Accordingly, by driving the motor 73, the vertical movement unit 71 can move vertically in the Z directions, that is, along a guide 76 either upwards from or downwards towards the base portion 70.

A gear 74C of the output shaft of the motor 74 meshes with a gear 79 of a shaft 78 that is included in the rotation support unit 72. Accordingly, by driving the motor 74, the rotation support unit 72 can swing about the rotating center axis SR in the G directions.

The motors 51 and 61 shown in FIG. 4 and the motors 73 and 74 shown in FIG. 3 are activated by instructions of the controller 100. In addition, the opening and the closing of each of the valves 42B, 47B, and 48B shown in FIG. 4 are also controlled by instructions of the controller 100. As the motors 51, 61, 73, and 74, servo motors may be used, for example.

Next, an exemplary operation of the above-described substrate treatment apparatus 10 will be described. The controller 100 activates the motor 19, which in turn makes the substrate W placed on top of the base member 17 rotate continuously in the R direction (see FIG. 1).

As FIG. 4 shows, by the control executed by the controller 100 to open or close the valves 42B, 47B, and 48B, a liquid for spraying, that is, the treatment liquid (mist) can be supplied to the surface S of the substrate W if the physical tool 40 is a spray nozzle. In addition, the liquid supply nozzle 45 can supply, for example, pure water to the surface S of the substrate W. The gas supply nozzle 46 can supply, for example, a nitrogen gas, which is an example of inert gases, to the surface S of the substrate W. The supply of the treatment liquid by the physical tool 40, the supply of the pure water by the liquid supply nozzle 45, and the supply of the nitrogen gas by the gas supply nozzle 46 can be performed while the nozzle head device (also referred to as the "arm body") 12 is swinging. Thus, the treatment on the surface S of the substrate W can be performed.

Upon the instruction of the controller 100, the physical tool unit 21 shown in FIGS. 4 and 5 is moved linearly in the T directions by the mechanism 23 for moving the physical tool unit 21. Upon the instruction of the controller 100, the liquid supply nozzle/gas supply nozzle unit 22 is moved linearly in the T directions by the mechanism 24 for moving the liquid supply nozzle/gas supply nozzle unit 22. The linear movement of the physical tool unit 21 and the linear movement of the liquid supply nozzle/gas supply nozzle unit 22 are synchronized with each other.

The physical tool unit 21 and the liquid supply nozzle/gas supply nozzle unit 22 move in opposite directions. Specifically, while the physical tool unit 21 is moving in a T1 direction, the liquid supply nozzle/gas supply nozzle unit 22 is moving in a T2 direction. Conversely, while the physical tool unit 21 is moving in the T2 direction, the liquid supply nozzle/gas supply nozzle unit 22 is moving in the T1 direction.

Figure 7A:
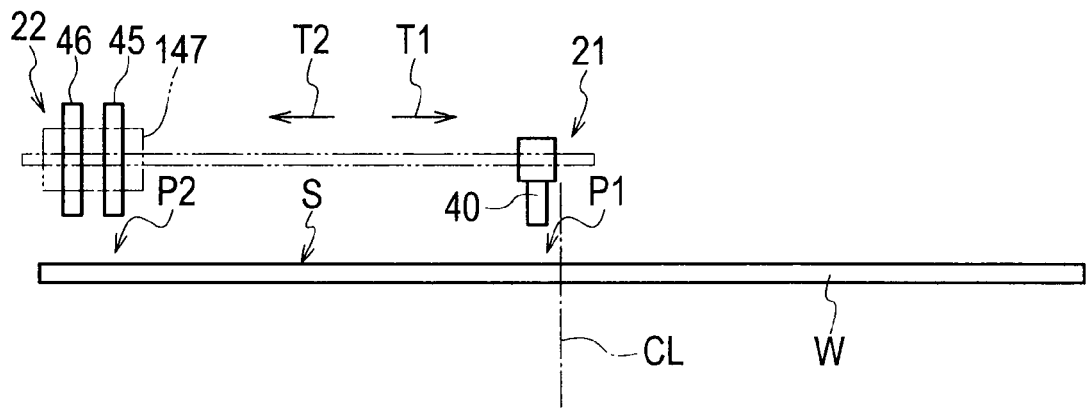
FIG. 7A is a first diagram illustrating a physical nozzle, a liquid supply nozzle, and a gas supply nozzle.
Figure 7B:
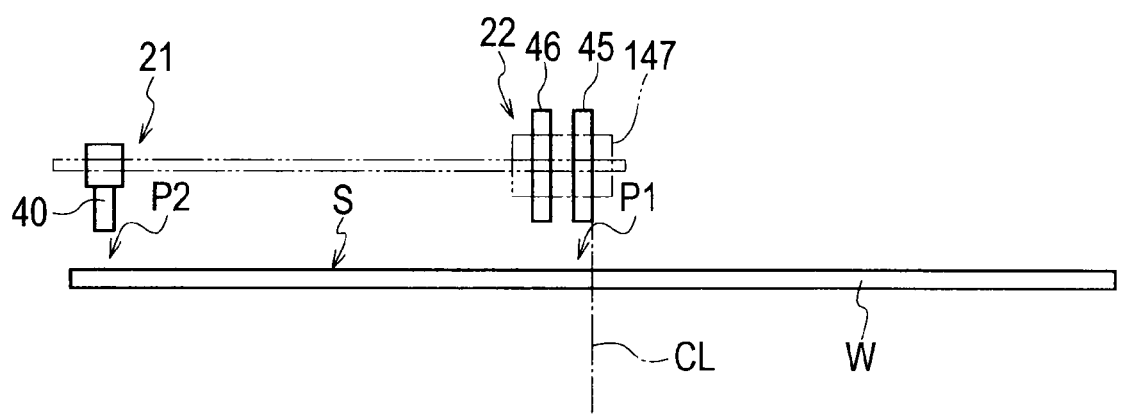
FIG. 7B is a second diagram illustrating the physical nozzle, the liquid supply nozzle, and the gas supply nozzle.
Figure 7C:
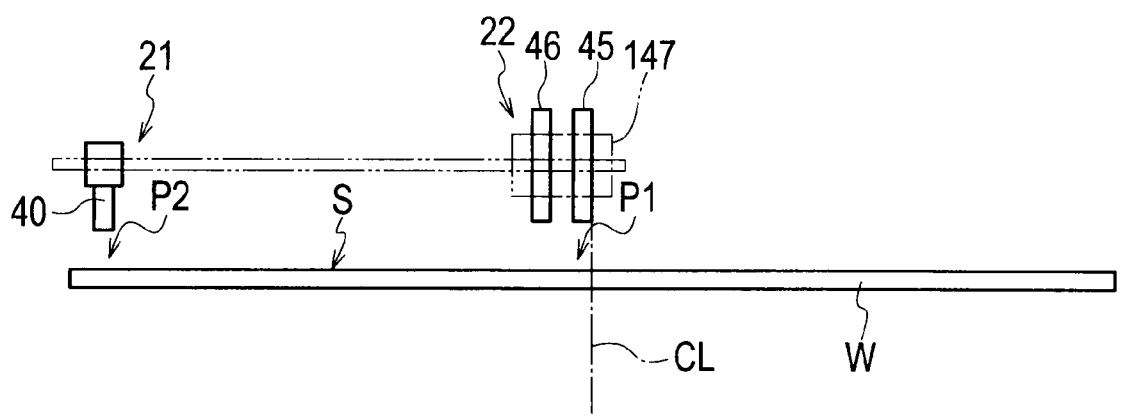
FIG. 7C is a third diagram illustrating the physical nozzle, the liquid supply nozzle, and the gas supply nozzle.

FIGS. 7A to 7C shows how the physical tool unit 21 and the liquid supply nozzle/gas supply nozzle unit 22 move in the T2 direction and in the T1 direction with respective to the top surface of the substrate W.

In the state shown in FIG. 7A, the physical tool unit 21 is located at a position P1 near the center of the substrate W whereas the liquid supply nozzle/gas supply nozzle unit 22 is located at a position P2 near the perimeter of the substrate W. Since the physical tool 40 is located at the position P1 near the center of the substrate W and the liquid supply nozzle/gas supply nozzle unit 22 is located at the position P2 near the perimeter of the substrate W in the state shown in FIG. 7A, the treatment on the portion around the position P1 near the center of the substrate W with the treatment liquid (mist) sprayed and supplied by the physical tool 40 is performed in parallel with the treatment on the peripheral portion of the substrate W (i.e., the portion around the position P2 near the perimeter of the substrate W) with, for example, the pure water supplied by the liquid supply nozzle 45.

While supplying the treatment liquid (mist), the physical tool (spray tool) 40 moves from the position P1 near the center of the substrate W to the position P2 near the perimeter of the substrate W. During the treatment of this period, particles on the substrate W are removed by supplying the treatment liquid (mist) to the substrate W. While supplying pure water from the nozzle, the liquid supply nozzle 45 moves from the position P2 near the perimeter of the substrate W to the position P1 near the center of the substrate W. The pure water is supplied so as to prevent the substrate W from drying. The pure water is supplied as the liquid supply nozzle 45 is moving in the opposite direction to the movement of the physical tool 40 so as to prevent the portion treated by the physical tool 40 from drying. Note that if the substrate W is left to dry naturally after the physical treatment, water marks (spots left by water) are left on the surface S of the substrate W.

When the physical tool unit 21 and the liquid supply nozzle/gas supply nozzle unit 22 that have been in the state shown in FIG. 7A move in the opposite directions and come to be in the state shown in FIG. 7B, the physical tool unit 21 is located at the position P2 near the perimeter of the substrate W and the liquid supply nozzle/gas supply nozzle unit 22 is located at the position P1 near the center of the substrate W. Since the physical tool 40 is located at the position P2 near the perimeter of the substrate W and the liquid supply nozzle/gas supply nozzle unit 22 is located at the position P1 near the center of the substrate W in the state shown in FIG. 7B, the treatment on the portion around the position P1 near the center of the substrate W with, for example, the pure water supplied by the liquid supply nozzle 45 of the liquid supply nozzle/gas supply nozzle unit 22 is performed in parallel with the treatment on the peripheral portion of the substrate W (i.e., the portion around the position P2 near the perimeter of the substrate W) with, for example, the treatment liquid (mist) sprayed and supplied by the physical tool 40.

In addition, in the state shown in FIG. 7C, the physical tool unit 21 is located at the position P2 near the perimeter of the substrate W and the liquid supply nozzle/gas supply nozzle unit 22 is located at the position P1 near the center of the substrate W. Gas is supplied by the gas supply nozzle 46 to the surface S of the substrate W. The gas supplied to the surface S of the substrate W is used for the treatment to dry the surface S of the substrate W with an inert gas. Since the surface S of the substrate W is dried immediately by use of the gas supplied in the above-described way, the surface of the substrate W can be reliably dried. Note that while the surface S of the substrate W is being dried, the gas is supplied with the rotating speed of the substrate W increased (up to a speed faster than the rotating speed at the time of cleaning) to drain the water from the surface S of the substrate W.

Note that, for example, while the physical tool 40 is moving relative to the nozzle head device (arm body) 12, the physical tool 40 supplies the liquid. In addition, while the nozzle head device 12 is swinging, the physical tool 40 moves relative to the nozzle head device 12. Moreover, while the nozzle head device 12 is swinging, the liquid supply nozzle 45 and the gas supply nozzle 46 move relative to the nozzle head device 12.

When the surface S of the substrate W is being dried, the supply from the physical tool 40 and the liquid supply nozzle 45 is stopped. While the gas supply nozzle 46 is moving from the position P1 near the center of the substrate W to the position P2 near the perimeter of the substrate W, the gas is blown out of the gas supply nozzle 46 so as to dry the substrate W. Alternatively, the drying operation may begin immediately after the cleaning operation is finished. To put it differently, the gas supply nozzle 46 moves so as to follow the physical tool 40. Accordingly, the drying operation can be performed with a dry gas immediately after the cleaning by the physical tool 40 (i.e., thus accomplished is displaced by dry gas) so as to prevent water marks (spots left by water) from being left on the surface S of the substrate W.

Figure 8:
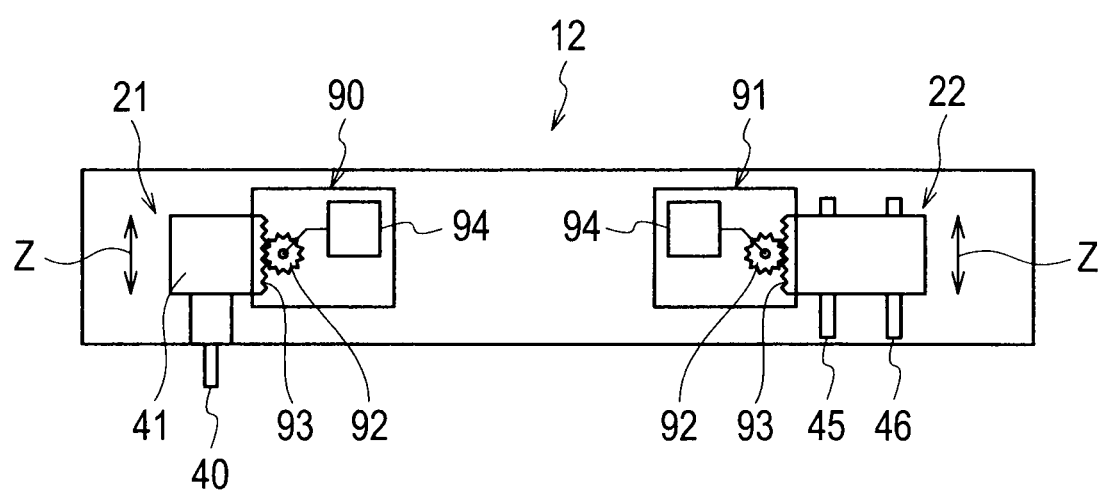
FIG. 8 is a diagram illustrating another embodiment of the present invention.

As a second embodiment of the present invention, the physical tool 40 of the physical tool unit 21 may be moved not only in the T directions by the moving mechanism 23 described above but also in Z directions by a vertical movement unit 90 as shown in FIG. 8. Likewise, the liquid supply nozzle 45 and the gas supply nozzle 46 of the liquid supply nozzle/gas supply nozzle unit 22 may be moved not only in the T directions by the moving mechanism 24 described above but also in the Z directions by a vertical movement unit 91. Each of the vertical movement units 90 and 91 includes a gear 92, a rack 93 that meshes with the gear 92, and a motor 94 to which the gear 92 is attached. When the motor 94 is activated by the instruction of the controller 100, the vertical movement unit 90 moves the physical tool 40 of the physical tool unit 21 in the Z directions to determine the position of the physical tool 40. Simultaneously, the vertical movement unit 91 moves the liquid supply nozzle 45 and the gas supply nozzle 46 of the liquid supply nozzle/gas supply nozzle unit 22 in the Z directions to determine the positions of the liquid supply nozzle 45 and the gas supply nozzle 46.

The nozzles are vertically moved so that the vertical positions of the nozzles can be controlled appropriately for the state of the treatment. For example, to enhance the power for cleaning the substrate W, the spray is supplied to the substrate W with the nozzle brought closer to the substrate W. The closer the nozzle is to the spray outlet, the higher the ejection pressure becomes and thus the stronger the cleaning power becomes. Consequently, the particles on the substrate W can be removed more effectively. Conversely, if the cleaning power becomes too strong, the patterns formed on the substrate W may collapse. So, the nozzle is kept at a higher position to soften the pressure imposed on the substrate W while the substrate W is being cleaned.

In conventional cases, if the surface S of the substrate W is a hydrophobic surface, and if the physical tool is the only means for treating the surface S of the substrate W, the coatability of the liquid on the surface S of the substrate W is impaired. If the surface S of the substrate W is dried in that state, water marks (spots left by water) are left on the surface S of the substrate W. According to the embodiments of the present invention, however, the surface S of the substrate W can be cleaned by using in combination the physical tool 40 and the cleaning tool equipped with the liquid supply nozzle 45 and the gas supply nozzle 46. By using both the physical tool 40 and the liquid supply nozzle 45 that are linearly moved in the opposite directions to each other, particles can be moved from the surface S of the substrate W of a variety of sizes while the formation of the water marks (spots left by water) can be reduced.

To be more specific, the substrate treatment apparatus of the present invention can handle the substrate W of a variety of sizes including a large-sized substrate W and a small-sized substrate W by changing the moving distances of the physical tool 40, the liquid supply nozzle 45, and the gas supply nozzle 46. In addition, the physical tool 40 supplies pure water immediately after the substrate W is cleaned so that the region that has been cleaned can be prevented from drying. Alternatively, the region that has been cleaned is immediately dried.

In these ways, water marks (spots left by water) can be prevented from being left on the surface S of the substrate W.

While being synchronized with the movement of the physical tool 40 in one direction, the liquid supply nozzle 45 moves in the opposite direction to the moving direction of the physical tool 40 and supplies the treatment liquid. To move the physical tool 40 and the liquid supply nozzle 45, servo motors and feed screws (ball screw) are used as described above. By the instructions of the controller 100 given to the servo motors, the positions and the speeds of the physical tool 40 and the liquid supply nozzle 45 can be controlled.

Note that the perimeter portion of the rotating substrate W moves at a different speed from the moving speed of the center portion of the substrate W. Accordingly, the speed of each of the physical tool 40 and the liquid supply nozzle 45 needs to be changed depending on which portion is being treated. To put it differently, uniform treatment on the substrate W requires the changing of the moving speed of the physical tool 40 or the liquid supply nozzle 45 so that the speed can be reduced as the corresponding member is moving from the center to the perimeter of the substrate W. Such controls of the speeds are executed by making the controller 100 give instructions to the servo motors in accordance with the positions of the physical tool 40 and the liquid supply nozzle 45. Each of the physical tool 40 and the liquid supply nozzle 45 moves from the perimeter to the center of the substrate W as well. In this case, the moving speed of each member is gradually increased as the member is moving from the perimeter to the center.

With the structures of the embodiments of the present invention, the coatability of the liquid on the entire surface of the substrate W can be improved, so that the surface S of the substrate W can be prevented from drying during the treatment. Accordingly, the formation of water marks (spots left by water) can be reduced. In addition, as FIG. 7C shows, after the treatment by the physical tool 40 and the treatment by the liquid supply nozzle 45 are stopped, an inert gas such as a nitrogen gas is blown out of the gas supply nozzle 46. Accordingly, the surface S of the substrate W can be dried immediately. Consequently, the formation of water marks (spots left by water) can be reduced and, at the same time, the surface S of the substrate W can be dried in a shorter time.

The substrate treatment apparatus according to the present invention is a substrate treatment apparatus that treats a surface of a substrate while rotating the substrate. The substrate treatment apparatus includes: a physical tool unit including a physical tool configured to treat the surface of the substrate; a nozzle unit including a liquid supply nozzle configured to supply a liquid to the surface of the substrate and a gas supply nozzle configured to supply a gas to the surface of the substrate; a physical-tool-unit moving mechanism configured to move the physical tool unit along the surface of the substrate; and a nozzle-unit moving mechanism configured to move the nozzle unit along the surface of the substrate. Accordingly, the coatability of a liquid on the entire surface of the substrate such as a semiconductor wafer can be enhanced, so that the substrate can be prevented from drying during the treatment. Consequently, the formation of water marks (spots left by water) can be reduced.

In addition, the substrate treatment apparatus according to the present invention includes: a nozzle head device including a case configured to house the physical tool unit, the nozzle unit, the physical-tool-unit moving mechanism, the nozzle-unit moving mechanism; and a nozzle-head-device moving unit configured to move the nozzle head device relative to the surface of the substrate. Accordingly, the nozzle head device moves along the surface of the substrate, so that the physical tool unit and the nozzle unit can perform the treatment at appropriate positions on the surface of the substrate.

In the substrate treatment apparatus according to the present invention, the nozzle-head-device moving unit includes: a vertical movement unit configured to move the nozzle head device upwards and downwards in a direction parallel to a direction in which a rotating center axis of the substrate extends; and a rotation support unit configured to swing the nozzle head device over the substrate. Accordingly, the nozzle head device can move upwards from or downwards towards the surface of the substrate, and can move rotationally relative to the surface of the substrate. Consequently, the physical tool unit and the nozzle unit can perform the treatment at appropriate positions on the surface of the substrate.

In the substrate treatment apparatus according to the present invention, the physical-tool-unit moving mechanism includes: a motor; and a feed screw configured to be rotated by the motor to move the physical tool unit. In addition, the nozzle-unit moving mechanism includes: a motor; and a feed screw configured to be rotated by the motor to move the nozzle unit in synchronization with the movement of the physical tool unit. Accordingly, the physical tool unit and the nozzle unit can reliably move in the opposite directions to each other. Consequently, while the physical unit is moving in one direction performing the treatment on the surface of the substrate, the nozzle unit can move in the opposite direction supplying a liquid and a gas to the substrate.

The substrate treatment method according to the present invention is a substrate treatment method for treating a surface of a substrate while rotating the substrate. The substrate treatment method includes the steps of: causing a physical-tool-unit moving mechanism to linearly move a physical tool unit along the surface of the substrate, the physical tool unit including a physical tool configured to treat the surface of the substrate; and causing a nozzle-unit moving mechanism to linearly move a nozzle unit along the surface of the substrate in a direction opposite to a direction in which the physical tool unit is linearly moved, the nozzle unit including a liquid supply nozzle configured to supply a liquid to the surface of the substrate and a gas supply nozzle configured to supply a gas to the surface of the substrate. Accordingly, the coatability of a liquid on the entire surface of the substrate such as a semiconductor wafer can be enhanced, so that the substrate can be prevented from drying during the treatment. Consequently, the formation of water marks (spots left by water) can be reduced.

In addition, each of the physical tool unit and the nozzle unit move linearly, so that a treatment liquid (mist) supplied by the physical tool and a treatment liquid supplied by the nozzle unit are less likely to interfere with each other. Accordingly, a liquid splash can be suppressed. Consequently, the formation of water marks (spots left by water) can be reduced when the surface of the substrate is dried.

According to the embodiment of the present invention, the nozzle-unit moving mechanism may move the nozzle unit so as to be synchronized with the liner movement of the physical tool unit but in the opposite direction to the direction in which the physical tool unit moves linearly. Alternatively, the nozzle-unit moving mechanism may move the nozzle unit so as to be independent from the movement of the physical tool unit without being synchronized with the movement of the physical tool unit. In the case of such an independent movement, the gas supply nozzle follows the movement of the physical tool. Accordingly, immediately after the cleaning by the physical tool, the surface of the substrate is dried by the dry gas. Consequently, water marks (spots left by water) can be prevented from being left on the surface of the substrate.

In addition, since each of the physical tool unit and the nozzle unit moves linearly, the treatment liquid is prevented from being pooled on the surface of the substrate. Consequently, particles can be prevented from adhering to the portion where the treatment liquid is pooled.

The embodiments described above are not the only forms of carrying out the present invention. Various modifications can be made to the above-described embodiments.

In addition, plural constituent elements described in those embodiments of the present invention may be combined appropriately to create other, different forms of the present invention. For example, some of the constituent elements shown in each of the above-described embodiments may be eliminated. In addition, some of the constituent elements of one embodiment may be combined appropriately with some of the constituent elements of other embodiments.

What is claimed is:

1. A substrate treatment apparatus that treats a surface of a substrate while rotating the substrate, the substrate treatment apparatus comprising:
    a physical tool unit including a physical tool configured to treat the surface of the substrate;
    a nozzle unit including a liquid supply nozzle configured to supply a liquid to the surface of the substrate and a gas supply nozzle configured to supply a gas to the surface of the substrate;
    a physical-tool-unit moving mechanism configured to move the physical tool unit along the surface of the substrate;
    a nozzle-unit moving mechanism configured to move the nozzle unit along the surface of the substrate;
    a nozzle head casing in which the physical tool unit, the nozzle unit, the physical-tool-unit moving mechanism, and the nozzle-unit moving mechanism are mounted;
    a nozzle-head-casing moving unit configured to move the nozzle head device relative to the surface of the substrate; and
    a controller configured to control
        the physical-tool-unit moving mechanism to linearly move the physical tool unit along the surface of the substrate,
        the nozzle-unit moving mechanism to linearly move the nozzle unit synchronized with the physical tool unit along the surface of the substrate in a direction opposite to a direction in which the physical tool unit is linearly moved thereby passing the physical tool unit and the nozzle unit in an antiparallel direction,
        the physical tool unit configured to treat the surface of the substrate and the nozzle unit configured to supply the liquid to the surface of the substrate at a same time under a condition that the substrate is rotating, and
        the physical tool unit configured to treat a position on the surface of the substrate different from a position that the nozzle unit is supplying the liquid.

2. The substrate treatment apparatus according to claim 1, wherein
    the nozzle-head-casing moving unit includes:
        a vertical movement unit configured to move the nozzle head device upwards and downwards in a direction parallel to a direction in which a rotating center axis of the substrate extends; and
        a rotation support unit configured to swing the nozzle head casing over the substrate.

3. The substrate treatment apparatus according to claim 1, wherein
   the physical-tool-unit moving mechanism includes a motor and a feed screw configured to be rotated by the motor to move the physical tool unit, and
   the nozzle-unit moving mechanism includes a motor and a feed screw configured to be rotated by the motor to move the nozzle unit in synchronization with the movement of the physical tool unit.

4. The substrate treatment apparatus according to claim 1, wherein the nozzle-unit moving mechanism linearly moves the nozzle unit in a direction opposite to a direction in which the physical tool unit is linearly moved.

5. A substrate treatment method for treating a surface of a substrate while rotating the substrate, the substrate treatment method comprising:
   mounting a physical tool unit, a nozzle unit, a physical-tool-unit moving mechanism, and a nozzle-unit moving mechanism in a nozzle head casing, the physical tool unit including a physical tool configured to treat the surface of the substrate, the nozzle unit including a liquid supply nozzle configured to supply a liquid to the surface of the substrate and a gas supply nozzle configured to supply a gas to the surface of the substrate, the physical-tool-unit moving mechanism configured to move the physical tool unit along the surface of the substrate, the nozzle-unit moving mechanism configured to move the nozzle unit along the surface of the substrate;
   moving the nozzle head casing relative to the surface of the substrate by a nozzle-head-casing moving unit;
   causing the physical-tool-unit moving mechanism to linearly move the physical tool unit along the surface of the substrate;
   causing the nozzle-unit moving mechanism to linearly move the nozzle unit synchronized with the physical tool unit along the surface of the substrate in a direction opposite to a direction in which the physical tool unit is linearly moved, thereby passing the physical tool unit and the nozzle unit in an antiparallel direction;
   treating the surface of the substrate by the physical tool unit and supplying the liquid to the surface of the substrate by the nozzle unit at a same time under a condition that the substrate is rotating; and
   treating, by the physical tool unit, a position on the surface of the substrate different from a position that the nozzle unit is supplying the liquid.

* * * * *